United States Patent
Qiu et al.

(10) Patent No.: US 7,955,911 B2
(45) Date of Patent: Jun. 7, 2011

(54) TFT-LCD PIXEL UNIT AND METHOD FOR MANUFACTURING THE SAME

(75) Inventors: Haijun Qiu, Beijing (CN); Zhangtao Wang, Beijing (CN); Tae Yup Min, Beijing (CN); Xu Chen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 528 days.

(21) Appl. No.: 11/952,252

(22) Filed: Dec. 7, 2007

(65) Prior Publication Data

US 2008/0142802 A1 Jun. 19, 2008

(30) Foreign Application Priority Data

Dec. 13, 2006 (CN) .......................... 2006 1 0165140

(51) Int. Cl.
*H01L 21/00* (2006.01)
*H01L 21/84* (2006.01)

(52) U.S. Cl. ... 438/151; 438/149; 438/158; 257/E21.37; 257/E21.415; 257/E21.143

(58) Field of Classification Search .................. 438/151
See application file for complete search history.

(56) References Cited

U.S. PATENT DOCUMENTS

| | | | | |
|---|---|---|---|---|
| 7,348,198 B2 * | 3/2008 | Ahn | ................................ | 438/30 |
| 7,391,483 B2 * | 6/2008 | Kawasaki | ....................... | 349/43 |
| 7,408,597 B2 * | 8/2008 | Lee et al. | ......................... | 349/43 |
| 7,425,508 B2 * | 9/2008 | Ahn et al. | ..................... | 438/694 |
| 7,687,330 B2 * | 3/2010 | Qiu et al. | ...................... | 438/151 |
| 2005/0270450 A1 | 12/2005 | Ahn et al. | | |
| 2006/0139549 A1* | 6/2006 | Ahn et al. | ..................... | 349/141 |
| 2006/0146216 A1* | 7/2006 | Ahn et al. | ....................... | 349/43 |
| 2007/0246707 A1 | 10/2007 | Deng | | |
| 2007/0272926 A1 | 11/2007 | Deng | | |
| 2007/0298554 A1 | 12/2007 | Long | | |
| 2008/0030639 A1 | 2/2008 | Qiu | | |

(Continued)

FOREIGN PATENT DOCUMENTS

CN 1707338 12/2005

OTHER PUBLICATIONS

U.S. Appl. No. 12/104,575, filed Apr. 17, 2008, Xinxin Li.

*Primary Examiner* — Charles D Garber
*Assistant Examiner* — Pape Sene
(74) *Attorney, Agent, or Firm* — Hasse & Nesbitt LLC; Daniel F. Nesbitt

(57) ABSTRACT

A thin film transistor liquid crystal display (TFT-LCD) pixel unit and a method for manufacturing the same. The pixel unit comprises a gate line and a gate electrode formed on a substrate and a first gate insulating layer, an active layer, and a doped layer that are sequentially formed on the gate line and the gate electrode. An intercepting trench is formed on the gate line to cut off the doped layer and the active layer on the gate line. A second insulating layer covers the intercepting trench and the substrate where the gate line and the gate electrode are not formed. A pixel electrode is formed on the second insulating layer and a part of the pixel electrode overlaps one of a source and drain electrodes.

10 Claims, 5 Drawing Sheets

U.S. PATENT DOCUMENTS

| | | |
|---|---|---|
| 2008/0061295 A1 | 3/2008 | Wang |
| 2008/0100766 A1 | 5/2008 | Ming |
| 2008/0105873 A1 | 5/2008 | Wang |
| 2008/0105874 A1 | 5/2008 | Wang |
| 2008/0111136 A1* | 5/2008 | Qiu et al. ........................ 257/72 |
| 2008/0111934 A1 | 5/2008 | Wu |
| 2008/0117347 A1 | 5/2008 | Zhang |
| 2008/0123007 A1 | 5/2008 | Cui |
| 2008/0123030 A1 | 5/2008 | Song |
| 2008/0142819 A1 | 6/2008 | Liu |
| 2008/0164470 A1 | 7/2008 | Wang |
| 2008/0166838 A1 | 7/2008 | Long |

* cited by examiner

TFT-LCD PIXEL UNIT AND METHOD FOR MANUFACTURING THE SAME

BACKGROUND OF THE INVENTION

The present invention relates to a thin film transistor liquid crystal display (TFT-LCD) pixel unit and a method for manufacturing the same.

Recently, in fabricating a conventional TFT LCD, generally a five-mask method is applied to an array process for fabricating array substrates, and partially a four-mask method is applied. A gray tone mask has been employed to etch a source/drain metal layer and an active layer in a channel portion of a TFT in the four-mask method.

The process for such conventional four-mask method comprises the following processes.

Firstly, a gate metal layer is formed by a conventional gate process, and then a gate insulating layer is deposited.

Secondly, a semiconductor active layer, a doped layer, and a source/drain metal layer are deposited. A gray tone photoresist pattern can be formed with a gray tone mask so as to form an island of a TFT by etching. An ashing process is performed to partially remove the photoresist pattern and thus expose the channel portion. Then the source/drain metal layer, the doped layer, and the active layer in the channel portion are etched successively with the remaining photoresist pattern. In this process, it is desired to strictly control the photoresist of the channel portion in the gray tone region. In addition, both the selective ratio and the uniformity in the etching are highly required. Therefore, there is required a strict process tolerance.

SUMMARY OF THE INVENTION

In view of the problems in the related art, in accordance with the exemplary embodiments of the present invention disclosed herein, a TFT-LCD pixel unit capable of decreasing the requirement for process tolerance and simplifying the design of a TFT is provided, together with a method for manufacturing the same.

An embodiment of the present invention provides a TFT-LCD pixel unit in which a TFT is formed by a photolithography process using three masks, so that the cost of an array process can be reduced, machine occupied time can be shortened, and yield can be increased, and a method for manufacturing the same.

According to one aspect of the present invention, there is provided a TFT-LCD pixel unit. The TFT-LCD pixel unit comprises a gate line and a gate electrode that are formed on a substrate. A first gate insulating layer, an active layer, and a doped layer are sequentially formed on the gate line and the gate electrode. A data line and source and drain electrodes are formed on the doped layer, and the data line is electrically connected to one of the source and drain electrodes. An intercepting trench is formed on the gate line to cut off the doped layer and the active layer on the gate line. A second insulating layer covers the intercepting trench and the glass substrate without the gate line and the gate electrode formed thereon. A pixel electrode is formed on the second insulating layer, and a part of the pixel electrode overlaps other one of the source and drain electrodes.

In an embodiment, the gate line and the gate electrode are a single-layer film made of one material selected from the group consisting of AlNd, Al, Cu, Mo, MoW and Cr, or a composite film made of at least one material selected from the group consisting of AlNd, Al, Cu, Mo, MoW and Cr.

In an embodiment, the first gate insulating layer and the second insulating layer are a single-layer film made of one material selected from the group consisting of SiNx, SiOx and SiOxNy, or a composite film made of at least one material selected from the group consisting of SiNx, SiOx and SiOxNy.

In an embodiment, the source and drain electrodes and the data line are a single-layer film made of one material selected from the group consisting of Mo, MoW and Cr, or a composite film made of at least one material selected from the group consisting of Mo, MoW, and Cr.

According to another aspect of the present invention, there is provided a method for manufacturing a TFT-LCD pixel unit. The method comprises the following three steps.

In step 1 with a first gray tone mask, a gate metal layer, a first gate insulating layer, an active layer, and a doped layer are sequentially deposited on a substrate. A first photoresist pattern is formed on the substrate with the first gray tone mask, including a photoresist-free region, a photoresist partially retained region, and a photoresist fully retained region. The photoresist-free region is etched to form patterns of a gate line and a gate electrode formed by the gate metal layer. An ashing process is performed on the first photoresist pattern to remove photoresist in the photoresist partially retained region entirely and reduce a thickness of photoresist in the photoresist fully retained region, such that a part of the doped layer on the gate line are exposed. The exposed doped layer and the active layer are etched to obtain an intercepting trench on the gate line.

In step 2 with a second mask, a source and drain metal layer is deposited on the substrate, and is patterned with the second mask to form a source and drain metal layer pattern.

In step 3 with a third gray tone mask, a transparent pixel electrode layer is deposited on the substrate. A third photoresist pattern is formed with the third mask on the substrate, including a third photoresist-free region and a third photoresist retained region. The third photoresist-free region is etched to form a TFT channel.

Preferably, in the step 1, after obtaining the intercepting trench, a second insulating layer is deposited. Next, a photoresist lift-off process is performed to lift off the second insulating layer above the gate line except the intercepting trench and the gate electrode.

Preferably, in the step 3, at the time of forming the channel, a data line and one of source and drain electrodes are integrally formed by the pixel electrode layer and the source and drain metal layer pattern, other one of the source and drain electrodes is formed by the source and drain metal layer pattern, a pixel electrode is formed by the pixel electrode layer, and a part of the pixel electrode overlaps the other one of the source and drain electrodes.

Preferably, the third mask is a gray tone mask, the third photoresist retained region comprises a third photoresist partially retained region and a third photoresist fully retained region. In the step 3, after etching the third photoresist-free region, an ashing process is performed to remove the photoresist in the third photoresist partially retained region entirely and to reduce a thickness of the photoresist in the third photoresist fully retained region, such that the data line and the one of the source and drain electrodes as a whole are exposed. Next, a passivation layer is deposited. Subsequently, a photoresist lift-off process is performed to lift off the remaining photoresist together with the passivation layer thereon, such that the pixel electrode is exposed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The foregoing and other features and advantages of the present invention will become more apparent from the following detailed description of the exemplary embodiments when taken in conjunction with the accompanying drawings, in which:

FIG. 1d is a cross-sectional view showing a gate electrode formed by etching a gate metal layer, taken along line A-A' in FIG. 1a.

FIG. 3b is a cross-sectional view taken along line D-D' in FIG. 3a.

DETAILED DESCRIPTION OF THE PREFERRED EMBODIMENTS

Figure 1A:
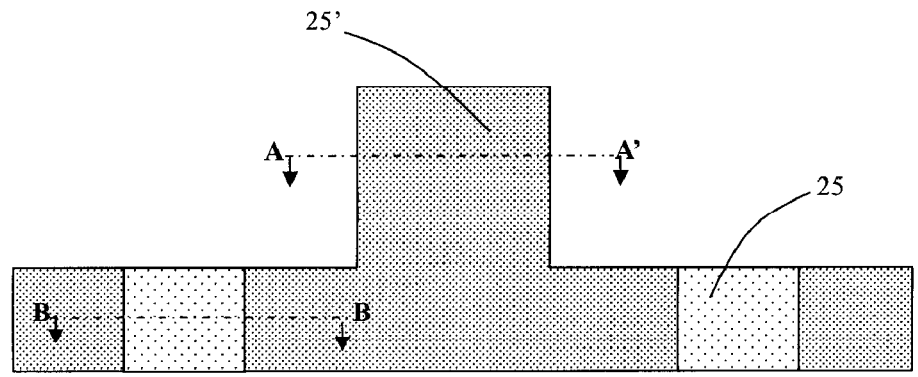
FIG. 1a is a plan view showing a photoresist pattern obtained with a first mask in an embodiment of the present invention.

The present invention will be described in detail hereinafter with reference to the accompanying drawings in which exemplary embodiments thereof are shown. The present invention may, however, be embodied in various forms and should not be construed as limited to the embodiments set forth herein. Rather, these embodiments are provided so that this disclosure will be thorough and complete, and will fully convey the concept of the invention to those skilled in the art. In the drawings, the thickness of layers and regions may be exaggerated for clarity. It will be understood that when an element or layer is referred to as being "on" or "connected to" another element or layer, it can be directly on or connected to the other element or layer, or an intervening element or layer may be present therebetween. For understanding easily, the same reference numeral is used to denote the same element common to drawings, if possible.

In this disclosure, a gray tone mask also comprises a half tone mask, in which a partial transparent region besides a full transparent region is formed. The partial transparent region can be realized as a slit structure in the form of a grating which reduces the transmittance of light by the scattering and diffraction of light passing therethrough, or as a translucent layer which reduces the transmittance of light passing therethrough. When a coated photoresist layer (e.g., a positive photoresist layer) is exposed with the gray tone mask, the full transparent region of the mask will completely expose the corresponding portion of the photoresist layer, while the partial transparent region will partially expose the corresponding portion of the photoresist layer. After the development of the photoresist layer, the completely exposed portion of the photoresist layer will be completely removed, while the partially exposed portion of the photoresist layer will be partially retained with a reduced thickness, so that the exposed photoresist layer is shaped into a three-dimension pattern.

A pixel unit of a TFT LCD according to an embodiment of the present invention comprises a substrate, a gate line, a gate electrode, a first gate insulating layer, an active layer, a doped layer, a second insulating layer, source and drain electrodes, a pixel electrode, a passivation layer, and the like. The first gate insulating layer, the active layer, and the doped layer are formed sequentially on the gate electrode and the gate line. An intercepting trench is formed on the gate line, so that the doped layer and the active layer on the gate line are cut off and the first gate insulating layer 22 is exposed by the intercepting trench. The second insulating layer covers the intercepting trench and the region of the substrate without the gate line and gate electrode formed thereon, that is, on the region of the substrate the gate line and the gate electrode are not formed. The pixel electrode is located above the second insulating layer. A part of the pixel electrode overlaps one of the source and drain electrodes. The passivation layer covers the region in which the pixel electrode is not formed.

The gate line and the gate electrode may be a single-layer film formed of a material selected from the group consisting of AlNd, Al, Cu, Mo, MoW, and Cr, or a composite film formed of at least one selected from the group consisting of AlNd, Al, Cu, Mo, MoW, and Cr.

The first gate insulating layer and the second insulating layer may be a single-layer film formed of a material selected from the group consisting of SiNx, SiOx, and SiOxNy, or a composite film formed of at least one selected from the group consisting of SiNx, SiOx, and SiOxNy.

The source and drain electrodes and the data line may be a single-layer film formed of a material selected from the group consisting of Mo, MoW, and Cr, or a composite film formed of at least one selected from the group consisting of Mo, MoW, and Cr.

An exemplary method for manufacturing the pixel unit according to the embodiment of the present invention may comprise the following steps.

Step 1, after a gate metal layer, a first gate insulating layer, an active layer, and a doped layer are deposited sequentially on a substrate, and then a photoresist layer is coated on the substrate. The coated photoresist layer is exposed by a first mask, which is a gray tone mask, and is developed to obtain a photoresist pattern including a photoresist-free region, a photoresist partially retained region, and a photoresist fully retained region, in which the photoresist-free region is a region other than that for forming a gate line and a gate island, and the photoresist partially retained region is a region for forming an intercepting trench on the gate line. The photoresist-free region is etched to form patterns of the gate line and the gate island, in which the doped layer, the active layer, the first gate insulating layer, and the gate metal layer are etched. After completing the above etching processes, an ashing process can be performed on the photoresist pattern to entirely remove the photoresist in the photoresist partially retained region, and to reduce the thickness of the photoresist in the photoresist fully retained region, so that a part of doped layer on the gate line is exposed. Then the exposed doped layer and the active layer thereunder are etched to obtain the intercepting trench on the gate line. After a second insulating layer is deposited, a photoresist lift-off process can be performed to lift off the remaining photoresist and second insulating layer deposited thereon above the gate island and the gate line except the intercepting trench.

Step 2, a source and drain metal layer is deposited on the resultant substrate of step 1, and is patterned with a second mask to form a source and drain metal layer pattern.

Step 3, a transparent pixel electrode layer is deposited on the resultant substrate of step 2, and then another photoresist layer is coated. The coated photoresist layer is exposed by a third mask, which is a gray tone mask also, and is developed to obtain a photoresist pattern including a photoresist-free region, a photoresist partially retained region, and a photoresist fully retained region, in which the photoresist partially retained region includes a region for integrally forming a data line and one of source and drain electrodes, the photoresist fully retained region includes a region for forming a pixel electrode and other one of the source and drain electrodes, and other portion is the photoresist-free region. The photoresist-free region can be etched to form a TFT channel, in which the pixel electrode layer, the source and drain metal layer pattern and the doped layer thereunder are etched. After completing the etching, an ashing process can be performed on the photoresist pattern to entirely remove the photoresist in the photoresist partially retained region and to reduce the thickness of the photoresist in the photoresist fully retained region, so that a data line and one of source and drain electrodes as a whole are exposed. After a passivation layer is deposited, a photoresist lift-off process can be performed to lift off the remaining photoresist and the passivation layer thereon, and thus a pixel electrode is exposed.

The exemplary method for manufacturing the pixel unit according to the embodiment of the present invention and the resultant pixel unit will be described in detail with reference to FIGS. 1a through 3f.

Figure 1B:
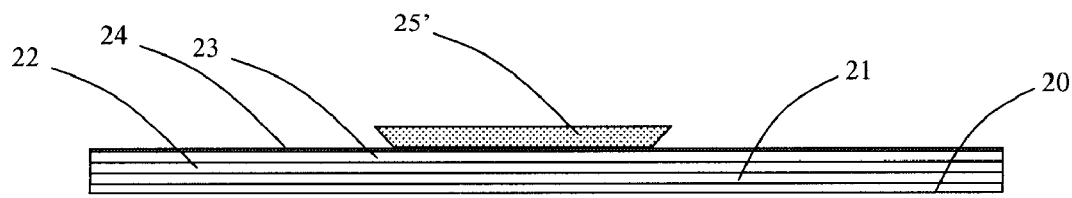
FIGS. 1b and 1c are cross-sectional views taken along lines A-A' and B-B' in FIG. 1a, respectively.
Figure 1C:
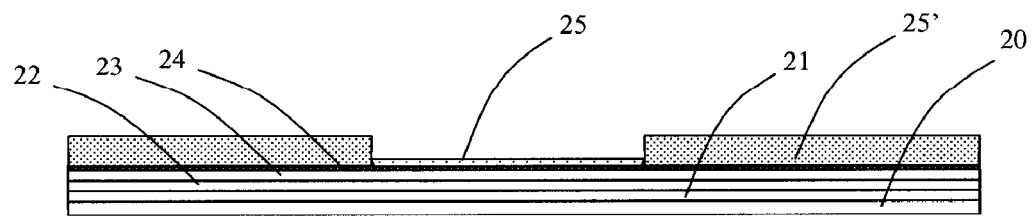

FIG. 1a is a plan view showing a photoresist pattern obtained by exposure and development with a first gray tone mask; and FIGS. 1b and 1c are cross-sectional views taken along lines A-A' and B-B' in FIG. 1a, respectively.

First, a gate metal layer 21 (e.g., Mo, Al/Nd, Cu or the like) is deposited on, for example, a clean glass substrate 20. A first gate insulating layer 22 (e.g., SiNx) is deposited on the gate metal layer A semiconductor active layer 23 (e.g., an amorphous silicon (a-Si) layer or a polysilicon (poly-Si) layer) is deposited on the first gate insulating layer, and then a semiconductor doped layer 24 (e.g., a p-type or an n-type semiconductor layer doped with B or P) is deposited on the semiconductor active layer 23. For example, a photoresist layer is spin-coated on the above stacked layers on the substrate. The spin-coated photoresist layer are exposed by the first gray tone mask to obtain a photoresist pattern with the profile of the gate line and the gate island that is used to form the gate electrode, as shown in FIGS. 1a-1c. In FIG. 1a, the strip portion of the photoresist pattern extending in horizontal direction corresponds to a region for the gate line, and the island portion protruding from the strip portion corresponds to a region for the gate electrode. As shown in FIG. 1a, a photoresist-free region without photoresist is a region other than a region in which a gate line 2 (shown in FIG. 1f) and a gate electrode 1 (shown in FIG. 1d) will be formed, a first photoresist 25 in the photoresist partially retained region is formed at the position where an intercepting trench 3 (shown in FIG. 1g) will be formed on the gate line, and a first photoresist 25' in the photoresist fully retained region is formed on the gate electrode and the other regions of the gate line than the intercepting trench.

Figure 1D:
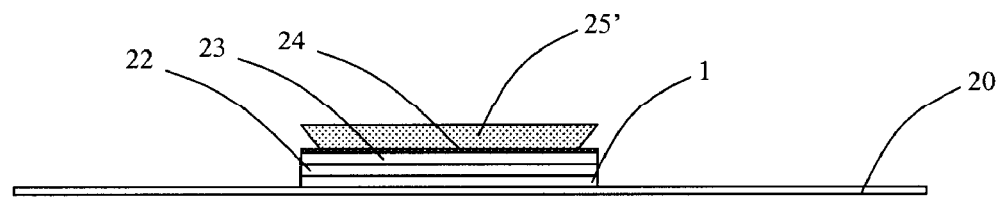
Figure 1E:
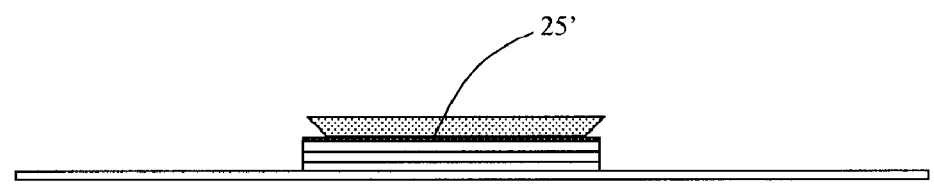
FIGS. 1e and 1f are cross-sectional views taken along lines A-A' and B-B' in FIG. 1a, respectively, after an ashing process is performed on the photoresist pattern.
Figure 1F:
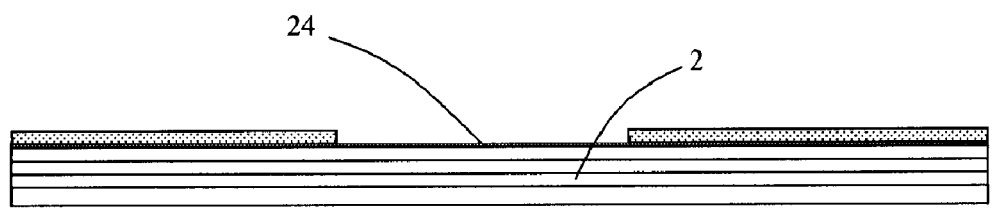
Figure 1G:
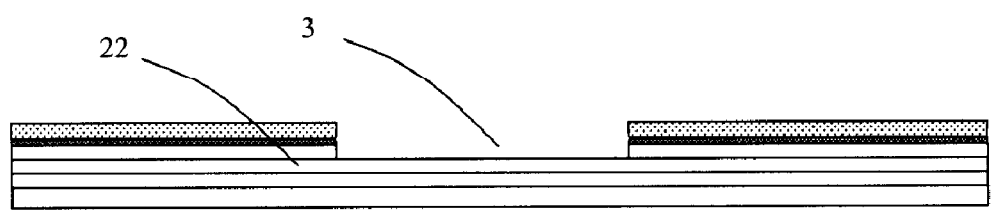
FIG. 1g is a cross-sectional view taken along line B-B' in FIG. 1a after forming an interception trench.

The doped layer 24, the active layer 23, the first gate insulating layer 22, and the gate metal layer 21 in the photoresist-free region, which are unprotected by the photoresist layer, are sequentially etched away, the glass substrate 20 is exposed, and thus the gate electrode 1 (shown in FIG. 1d) and the gate line 2 (shown in FIG. 1f) are formed by etching the gate metal layer 21. FIG. 1d is a cross-sectional view showing the resultant structure taken along line A-A' in FIG. 1a. Then a photoresist ashing process is performed to entirely remove the photoresist 25 in the photoresist partially retained region so that a part of doped layer 24 on the gate line 2 is exposed as shown in FIG. 1f through the remaining photoresist pattern, and to reduce the thickness of the photoresist 25' in the photoresist fully retained region. Then the exposed doped layer 24 and the active layer 23 thereunder are etched until the first gate insulating layer 22 is exposed, so that the intercepting trench 3 on the gate line is formed, as shown in FIG. 1g.

Figure 1H:
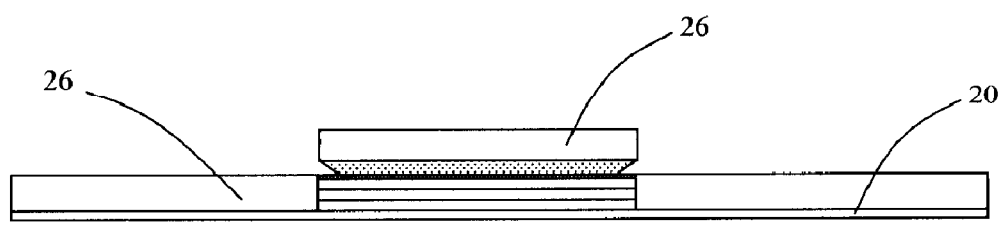
FIG. 1h is a cross-sectional view taken along A-A' in FIG. 1a after depositing a second insulating layer.
Figure 1I:
FIGS. 1i and 1j are cross-sectional views taken along lines A-A' and B-B', in FIG. 1a, respectively, after performing a lift-off process.
Figure 1J:
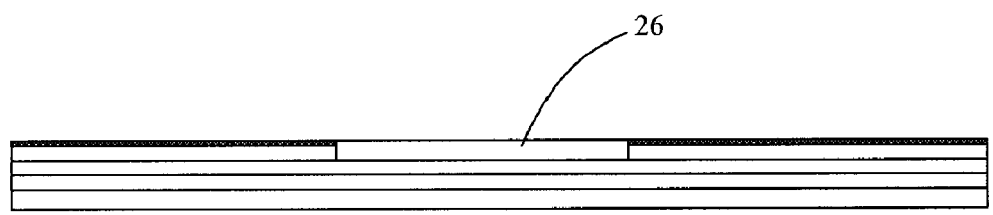
Figure 1K:
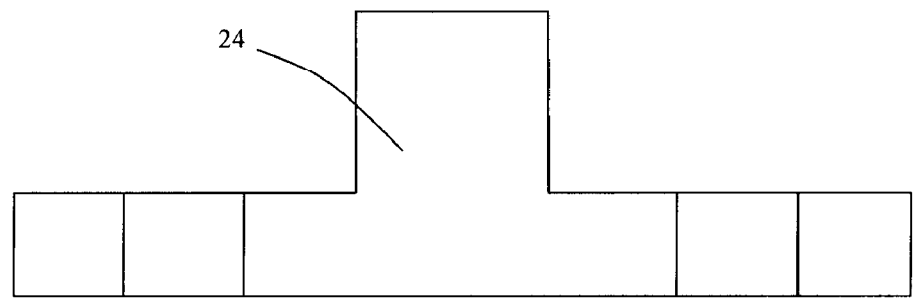
FIG. 1k shows a schematic plan view of the whole pixel obtained using the first gray tone mask.

The second insulating layer 26 is blanket-deposited on the substrate to protect the gate electrode 1, as shown in FIG. 1h. After performing a photoresist lift-off process, the second insulating layer 26 covering the photoresist layer above the gate line and the gate island can be lift off. As a result, the doped layer 24 on the gate electrode 1 is exposed as shown in FIG. 1i; and the intercepting trench 3 is covered by the second insulating layer 26 as shown in FIG. 1j. It can be seen from the drawings that the second insulating layer 26 can be used to planarize the surface of the resultant substrate substantially. Therefore, entire process using the first mask has been accomplished, and thus the schematic plan view of a whole pixel is obtained as shown in FIG. 1k. In FIG. 1k, the strip gate line 2 extends in the horizontal direction, the gate electrode 1 protrudes from the gate line 2, and the second insulating layer 26 covers the intercepting trench 3 on the gate line 2 and the glass substrate 20 without the gate line 2 and the gate electrode 1 formed thereon.

Figure 2A:
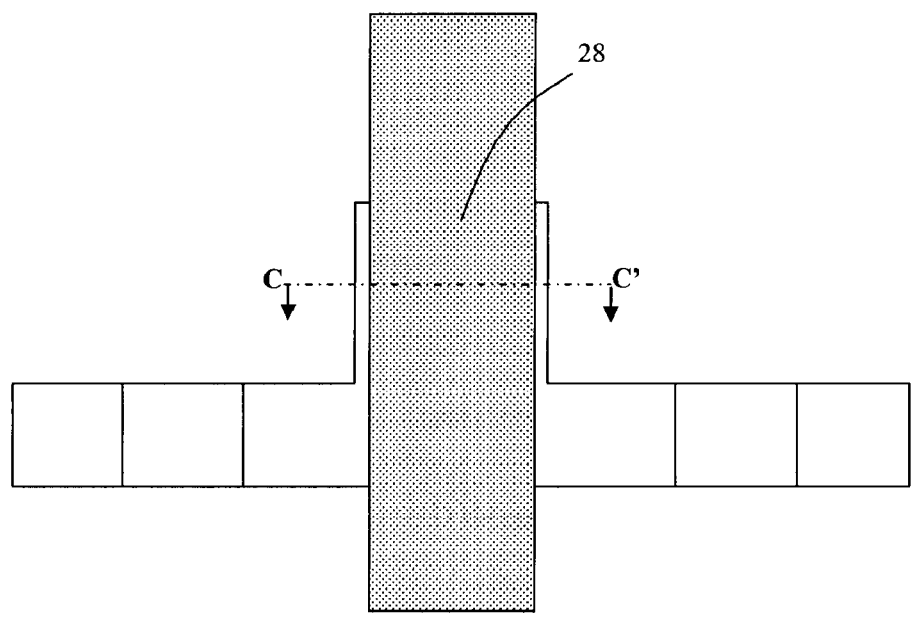
FIG. 2a is a plan view after exposure and development with a second conventional mask according to the embodiment of the present invention.
Figure 2B:
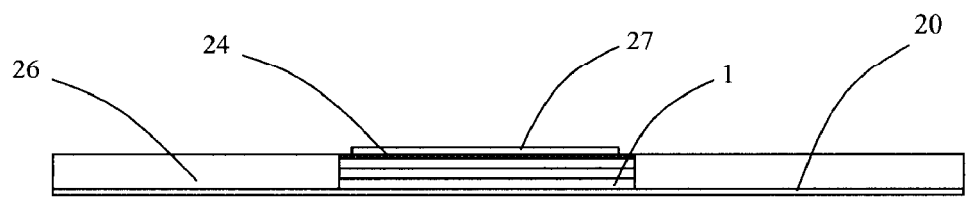
FIG. 2b is a cross-sectional view taken along line C-C' in FIG. 2a after etching the source and drain metal layer with the second conventional mask.

After that, a source and drain metal layer (e.g., Mo, Al, Cu or the like) is deposited on the resultant structure, and next a second photoresist layer is coated. Through exposure and development with a second conventional mask, a photoresist pattern 28 is formed, as shown in FIG. 2a. Then, the source and drain metal layer is etched using the photoresist pattern 28 as a mask, and thereby a source and drain metal layer pattern 27 is obtained, as shown in FIG. 2b.

Figure 3A:
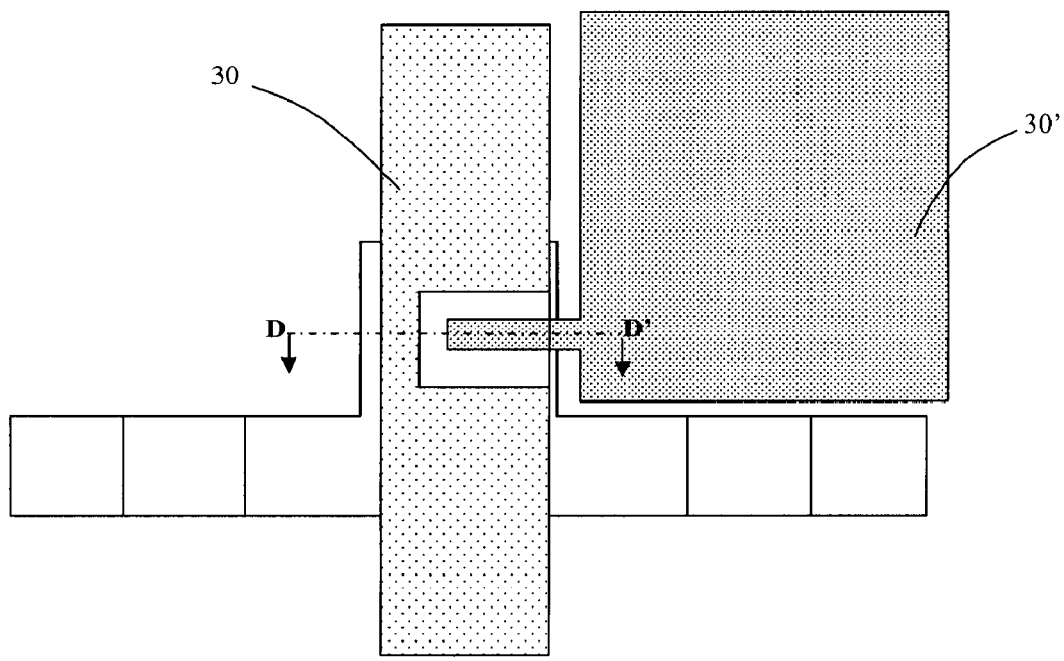
FIG. 3a is a plan view after exposure and development with a third gray tone mask according to the embodiment of the present invention.
Figure 3B:
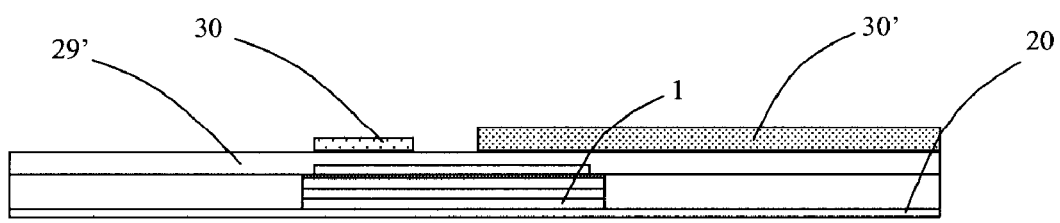

FIG. 3a is a plan view after exposure and development with a third gray tone mask according to the embodiment of the present invention; and FIG. 3b is a cross-sectional view taken along line D-D' in FIG. 3a.

A transparent pixel electrode layer 29' (e.g. an indium tin oxide (ITO) layer or the like) is on the resultant structure and a third photoresist layer is coated. Through exposure and development with a third gray tone mask, a photoresist pattern is formed, as shown by shadow in FIG. 3a. In the photoresist pattern, a relatively thin photoresist, i.e., the third photoresist 30 in the photoresist partially retained region (gray tone region) is formed in a source electrode region and a data line region, a relatively thick photoresist, i.e., the third photoresist 30' in the photoresist fully retained region (full tone region) is formed in a drain electrode region and a pixel electrode region, and the other region is a photoresist-free region without photoresist. At this time, a channel portion of the TFT to be formed is exposed through the photoresist-free region, as shown in FIG. 3b.

Figure 3C:
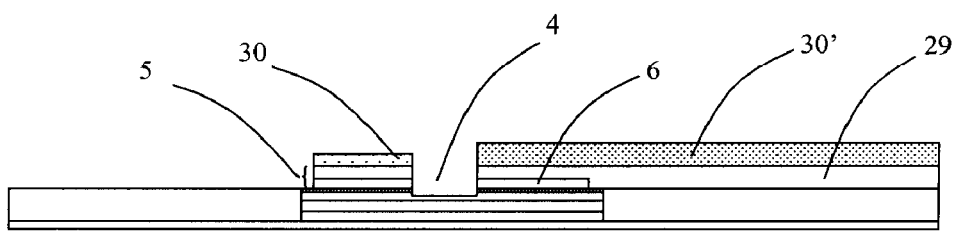
FIG. 3c is a cross-sectional view taken along line D-D' in FIG. 3a after forming a channel.
Figure 3D:
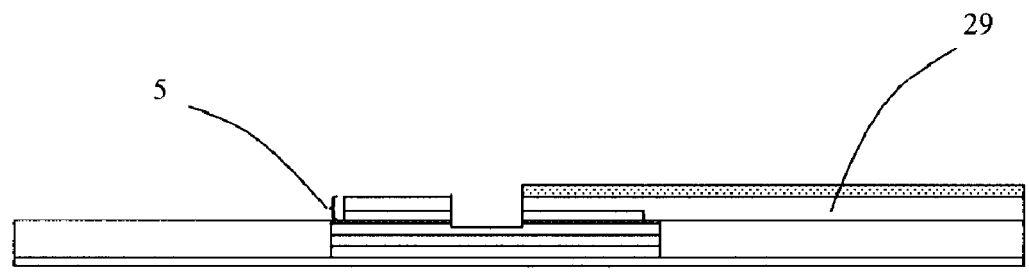
FIG. 3d is a cross-sectional view taken along line D-D' in FIG. 3a after a photoresist ashing process.
Figure 3E:
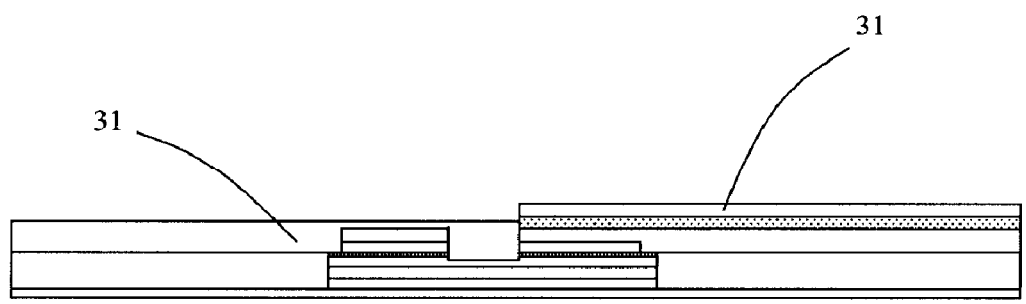
FIG. 3e is a cross-sectional view taken along line D-D' in FIG. 3a after a passivation layer deposition.
Figure 3F:
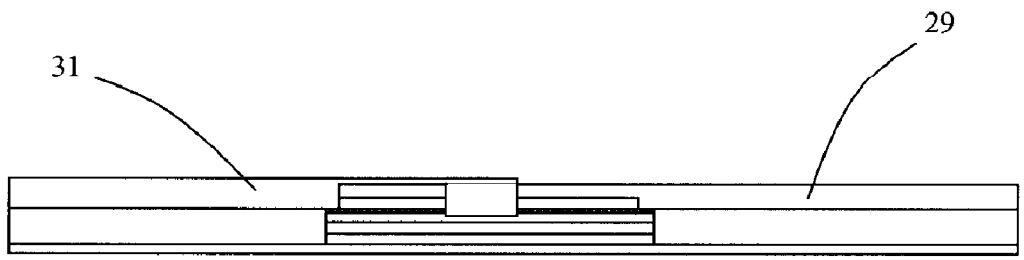
FIG. 3f is a cross-sectional view taken along line D-D' in FIG. 3a after a photoresist lifting-off.

An etching is performed on the photoresist-free region, i.e., the region not being protected by the photoresist. During etching, the transparent pixel electrode layer 29', the source and drain metal layer pattern 27, and the doped layer are etched so as to form a TFT channel 4, as shown in FIG. 3c. Meanwhile, the source electrode 5 and the data line (extending in vertical direction in FIG. 3a) are integrally formed by etching the transparent pixel electrode layer 29' and the source and drain metal layer pattern 27, the drain electrode 6 is formed by etching the source and drain metal layer pattern 27, and the pixel electrode 29, a part of which overlaps the drain electrode 6, is formed by etching the pixel electrode layer 29'. Subsequently, a photoresist ashing process is carried out. The third photoresist 30 in the photoresist partially retained region is removed entirely so that the source electrode 5 and the data line are exposed, as shown in FIG. 3d, and a part of photoresist 30' is remained in the drain electrode region and the pixel electrode region. Next, a passivation layer 31 is deposited, as shown in FIG. 3e. Then the remaining photoresist, together with the passivation layer deposited thereon, is stripped by a photoresist lift-off process, and thereby the pixel electrode 29 is exposed. The final pattern is obtained as shown in FIG. 3f.

In the exemplary embodiment, the data line and the source electrode are integrally formed by patterning the pixel electrode layer and the source and drain metal layer pattern, and a part of the pixel electrode overlaps the drain electrode. In another embodiments, the data line and the drain electrode may be integrally formed by patterning the pixel electrode layer and the source and drain layer pattern, and a part of the pixel electrode may overlap the source electrode.

The above illustrative embodiments are exemplary manufacturing methods, while other methods can also be implemented by choosing various materials or their combination or by selecting various photolithography processes. It is apparent for those skilled in the art that the structure of TFT device may have various modifications and change in the position and direction of TFT and the overlapping mode of the gate electrode with the source and drain electrodes. These modifications and change are included in the scope of the present invention.

In the foregoing description, photoresist ashing process, lift-off process and the like can performed as those known in the art, so the detailed description for those are omitted herein. The present invention is not limited to these processes.

In the embodiment, the gate line and the gate electrode, the active layer, the doped layer, the second insulating layer, and the intercepting trench on the gate line are formed with the first gray tone mask in conjunction with the lift-off process. And the channel and the transparent pixel electrode are formed with the third gray tone mask. Thus, cost of the array process is reduced, machine occupied time is shortened, and yield is increased. Further, since the planarization has been implemented with the second insulating layer in the step using the first gray tone mask, process tolerance can be increased in the subsequent steps. In addition, the transparent pixel electrode is served as a part of the drain electrode of TFT, and therefore problem of contact resistance can be avoided.

Although exemplary embodiment of the present invention has been described, it is understood that the present invention should not be limited to these exemplary embodiments but various modification and equivalents thereof can be made by those skilled in the art within the spirit and scope of the present invention as defined in the appended claims.

What is claimed is:

1. A method for manufacturing a TFT-LCD pixel unit, comprising:
   a) step 1 using a first gray tone mask, comprising:
      i) sequentially depositing a gate metal layer, a first gate insulating layer, an active layer, and a doped layer on a substrate;
      ii) forming a first photoresist pattern on the substrate with the first gray tone mask, including a first photoresist-free region, a first photoresist partially retained region, and a first photoresist fully retained region;
      iii) etching the first photoresist-free region to expose the substrate and to form a gate line and a gate electrode from the gate metal layer;
      iv) performing an ashing process on the first photoresist pattern to remove photoresist in the first photoresist partially retained region entirely and reduce a thickness of photoresist in the first photoresist fully retained region, such that a part of the doped layer on the gate line are exposed;
      v) etching the exposed doped layer and the active layer to obtain an intercepting trench on the gate line;
   b) step 2 using a second mask, comprising:
      i) depositing a source and drain metal layer on the substrate; and
      ii) patterning the source and drain metal layer with the second mask to obtain a source and drain metal layer pattern, and
   c) step 3 using a third gray tone mask, comprising:
      i) depositing a pixel electrode layer on the substrate;
      ii) forming a third photoresist pattern with the third mask on the substrate, including a third photoresist-free region and a third photoresist retained region; and
      iii) etching the third photoresist-free region to form a TFT channel.

2. The method as claimed in claim 1, wherein in the step 1 the first photoresist-free region is a region other than that for forming the gate line and the gate electrode, and the first photoresist partially retained region is a region for forming the intercepting trench on the gate line.

3. The method as claimed in claim 1, wherein in the step 1 etching the first photoresist-free region includes etching of the doped layer, the active layer, the first gate insulating layer, and the gate metal layer.

4. The method as claimed in claim 1, the step 1 further comprising after v):
   depositing a second insulating layer; and
   performing a photoresist lift-off process to lift off the second insulating layer above the gate electrode and the gate line except the intercepting trench.

5. The method as claimed in claim 1, wherein in step 3 at the time of forming a TFT channel, a data line and one of source and drain electrodes are integrally formed by the pixel electrode layer and the source and drain metal layer pattern, other one of the source and drain electrodes is formed by the source and drain metal layer pattern, a pixel electrode is formed by the pixel electrode layer, and a part of the pixel electrode overlaps the other one of the source and drain electrodes.

6. The method as claimed in claim 5, wherein the third mask is a gray tone mask, the third photoresist retained region comprises a third photoresist partially retained region and a third photoresist fully retained region, and step 3 further comprising after iii):

performing an ashing process on the photoresist to remove photoresist in the third photoresist partially retained region entirely and reduce a thickness of photoresist in the third photoresist fully retained region, such that the data line and the one of the source and drain electrodes as a whole are exposed;

depositing a passivation layer; and performing a photoresist lift-off process to lift off the remaining photoresist together with the passivation layer thereon, such that the pixel electrode is exposed.

7. The method as claimed in claim 6, wherein in the step 3 the third photoresist partially retained region includes a region for integrally forming the date line and the one of the source and drain electrodes; the third photoresist fully retained region includes a region for forming the pixel electrode and the other one of the source and drain electrodes; and other portion is the third photoresist-free region.

8. The method as claimed in claim 1, wherein in the step 3 etching the third photoresist-free region to obtain the TFT channel includes etching of the pixel electrode layer, the source and drain metal layer pattern and the doped layer.

9. The method as claimed in claim 7, wherein in the step 3 etching the third photoresist-free region to obtain the TFT channel includes etching of the pixel electrode layer, the source and drain metal layer pattern and the doped layer.

10. A TFT-LCD pixel unit, made according to the method of claim 1.

* * * * *